United States Patent [15] 3,642,528

Kimura [45] Feb. 15, 1972

[54] SEMICONDUCTOR DEVICE AND METHOD OF MAKING SAME

[72] Inventor: Akihiro Kimura, Takatsuki-shi, Japan

[73] Assignee: Matsushita Electronics Corporation, Osaka, Japan

[22] Filed: May 27, 1969

[21] Appl. No.: 828,301

[30] Foreign Application Priority Data

June 5, 1968 Japan....................................43/39252
Aug. 12, 1968 Japan....................................43/57738
Aug. 12, 1968 Japan....................................43/57739

[52] U.S. Cl.....................................117/212, 117/8, 117/217
[51] Int. Cl.....................................H01l 3/16
[58] Field of Search....................................117/212, 217, 8

[56] References Cited

UNITED STATES PATENTS 3,231,421 1/1966 Schmidt....................................117/212

*Primary Examiner*—Alfred L. Leavitt
*Assistant Examiner*—Alan Grimaldi
*Attorney*—Stevens, Davis, Miller & Mosher

[57] ABSTRACT

A palladium film deposited on a silicon oxide layer peels off when subjected to a gas containing hydrogen. A palladium film of a predetermined shape can be formed on a semiconductor body by forming a silicon oxide film on the body, making a contact window of desired shape in the oxide film to expose the semiconductor body, then depositing palladium on the body and the oxide film and then subjecting the assembly to a gas containing hydrogen thereby to peel off that part of the palladium film which is on the silicon oxide film leaving the palladium film which is on the contact window.

7 Claims, 12 Drawing Figures

AKIHIRO KIMURA
INVENTOR

BY STEVENS, DAVIS, MILLER & MOSHER
ATTORNEYS

SEMICONDUCTOR DEVICE AND METHOD OF MAKING SAME

This invention relates to a method of making a semiconductor device having a metal electrode deposited on a semiconductor body and the device made by such method, and more particularly to a method of making a semiconductor device employing palladium or an alloy including palladium as the main component as the electrode metal and devices made by such method.

It is well known to provide a metal electrode making an ohmic contact, such as aluminum, on a semiconductor body, such as silicon, germanium or gallium arsenide, or to provide a metal electrode forming a Schottky-type potential barrier on a semiconductor body by adhering a metal such as molybdenum, tungsten, nickel, platinum, gold or palladium on a semiconductor body. Especially, diodes utilizing the rectifying function of the Schottky barrier are effectively used for high-frequency applications. In particular, planar-type devices are well known for their ease of sealing techniques and hence their good stability.

According to the conventional method of making a diode of the Schottky barrier-type, first an insulating film composed of silicon oxide is formed on a semiconductor body and a window of desired shape is formed in the insulating film to expose the semiconductor body thereat. Then, a metal film for forming a barrier is brought into contact with the semiconductor body by vacuum evaporation, sputtering, or chemical vapor deposition. An electrode film is provided on this film and a leadout wire is further attached on this electrode layer to obtain a planar-type diode. When platinum, gold or palladium is used as this metal film the adhesive force between these metals and the silicon oxide layer is weak. Therefore, it has been necessary to interpose an intermediate layer such as chromium or titanium between the metal film and the oxide layer which should adhere to both materials firmly. Thus, the manufacture is necessarily complicated.

This invention provides an industrially useful method for making a semiconductor device having high stability utilizing palladium among the above metals.

This invention also provides a semiconductor device comprising a semiconductor body, a silicon oxide film coated on the body and having at least one contact window, and a palladium film contiguous to the body through said window.

The method of this invention is characterized by the steps of forming a silicon oxide film on a semiconductor surface, forming at least one contact window in the oxide film to expose the semiconductor surface thereat, and/or covering part of the oxide film with a material adhesive to the semiconductor body or to the oxide film if necessary, then vacuum depositing metallic palladium film on the whole surface and subjecting the metallic palladium film to a gas containing hydrogen so as to peel off the metal film in the part contiguous to the silicon oxide film but leaving the film in the part contiguous to the semiconductor body or to the material adhered to the silicon oxide film.

According to another form of this invention, there is provided a method of making a semiconductor device comprising the steps of forming a silicon oxide film on a semiconductor body, making at least one contact window in the oxide film to expose the semiconductor body by a well-known photoetching technique, then depositing a palladium film on the whole surface of the semiconductor body and if necessary a metal electrode film such as of aluminum, and subjecting the assembly to a gas containing hydrogen to peel off the palladium film together with the metal electrode film on the silicon oxide film but leaving the palladium film in said window.

Other objects, features and advantages will be apparent from he following description with reference to the accompanying drawings, in which.

Figure 8:
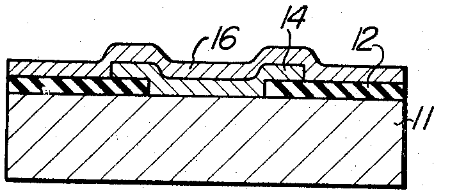
Figure 9:
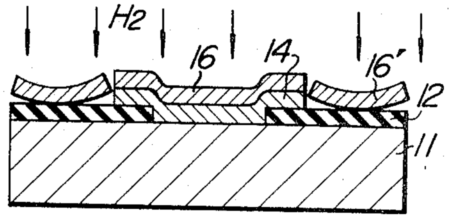
Figure 10:
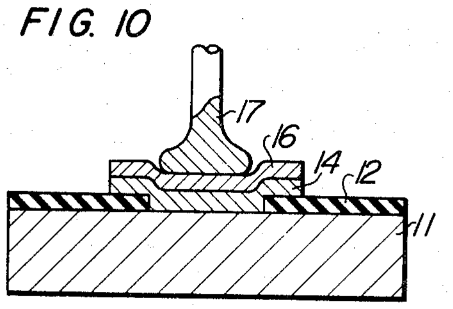
Figure 11:
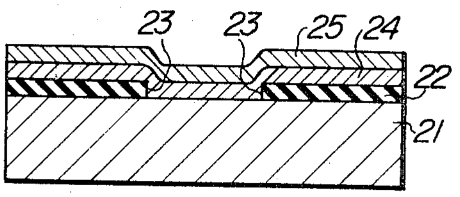
Figure 12:
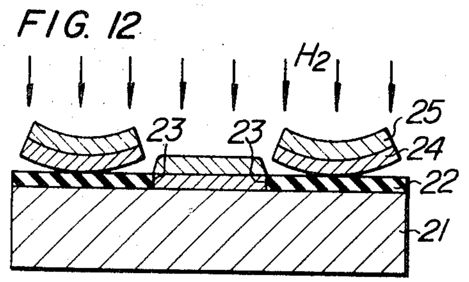

FIGS. 6 to 9 schematically show how a semiconductor device would appear in various steps of the manufacture according to the invention;

FIG. 10 shows schematically an applied form of a semiconductor device made through the steps of FIGS. 6 to 9; and FIGS. 11 and 12 schematically show how a semiconductor device would appear in various steps of the manufacture according to the invention.

In the FIGURES, similar reference numerals indicate similar parts.

Figure 1:
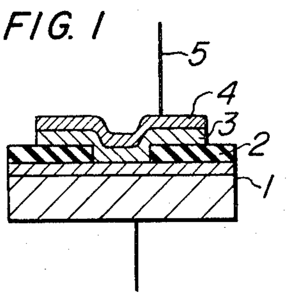
FIG. 1 is a schematic sectional diagram showing a conventional semiconductor device of diode structure.

FIG. 1 shows a conventional semiconductor device of Schottky barrier-type diode structure comprising a silicon semiconductor body 1, an insulating layer 2 formed on the body 1 and consisting of silicon oxide, the insulating film having a window of desired shape which exposes the semiconductor surface, a metal film 3 deposited on the body 1 and the insulating film 2, an electrode film 4 provided on the metal film 3, and a leadout wire 5. When platinum, gold or palladium is used as the metal film 3, the bonding force between it and the silicon oxide film is weak so that it, especially when it is a palladium film, is easy to peel off. Therefore, it is necessary to interpose an intermediate layer 6, such as of chromium or titanium, which is strongly adhesive to both layers (see FIG. 2). Such a troublesome process can be eliminated by this invention.

Figure 3:
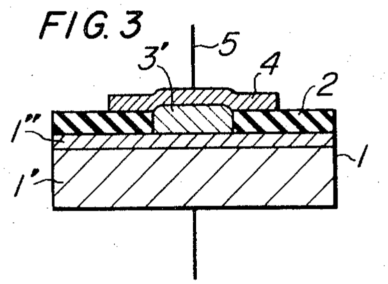
FIG. 3 is a schematic sectional diagram showing a semiconductor device of diode structure made according to the invention.
Figure 4:
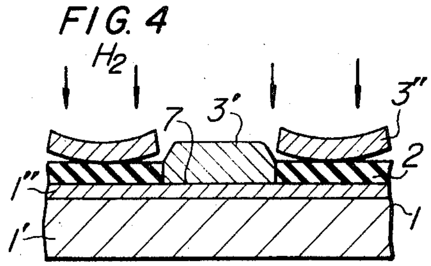
FIG. 4 is a schematic sectional diagram showing an intermediate step of the manufacture of the semiconductor device shown in FIG. 3.
Figure 5:
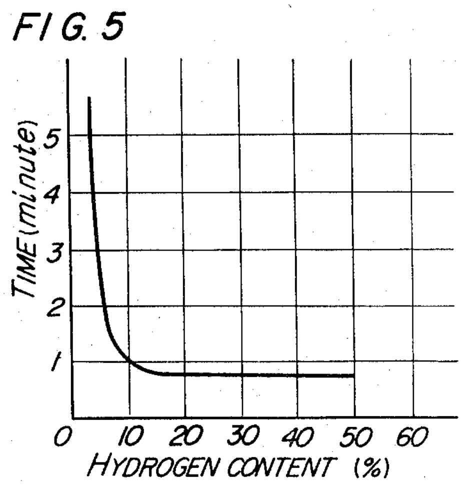
FIG. 5 shows the experimental result of peeling off phenomena.

FIG. 3 shows a schematic cross section of a diode to be made in accordance with the invention. The diode includes an N-type silicon body 1 comprising a silicon body 1′of specific resistivity 0.005 Ωcm. provided with a epitaxial silicon layer 1″ of specific resistivity 0.1–1 Ωcm. and thickness 1–5 μ. A silicon oxide layer 2 of about 5,000 A. thick is formed on the silicon body 1, for example by thermal decomposition of organo-oxysilane. Then, a contact window of about 30 μ diameter is made to expose the silicon body 1. After the surface of such an assembly is cleaned by a predetermined surface-cleaning treatment, a palladium film is vapor deposited on the assembly to a desired thickness by heating palladium in a high vacuum of about $4\times10^{-6}$ torr. In high vacuum, a palladium film and a silicon oxide layer are adhered together firmly without any peeling off. But when the palladium film is exposed to a gas containing hydrogen ($H_2$), the palladium film 3″ deposited on the silicon oxide layer begins to peel off from the edge portion, as is shown in FIG. 4. The reason for this phenomenon is not clear but it is considered that a metal palladium film absorbs hydrogen gas and thereby expands to cause an occurrence of internal stress, while absorbed hydrogen may reach the silicon oxide layer to cause reduction thereof. Thus, weak bonding between the silicon oxide layer and the palladium film is further weakened to allow the palladium film to peel off. It was found by experiments that the time needed to begin peeling off becomes extremely short when the hydrogen content in nitrogen gas becomes more than 10%. FIG. 5 shows an example of the results of such an experiment. As the carrier gas containing the hydrogen, other inert gases or air may be used equally as well as nitrogen.

The palladium film 3′ deposited directly on silicon is firmly adhered to the silicon body and will not peel off even when it is subjected to hydrogen gas. The palladium film forms a Schottky-type potential barrier at the interface with the silicon body and exhibits rectifying property.

Such peeled palladium film on a silicon oxide layer can be removed easily by blowing nitrogen or air. Only the palladium film 3′ on the silicon body remains after such blowing.

Next, a metal electrode film 4, such as of aluminum, is deposited to a thickness of about 5,000 A. as can be seen in FIG. 3, and leadout wire 5 is attached further thereon to complete the structure of diode shown in FIG. 3. In the manufacture of such element, the thickness of deposited palladium film is material and found by experiments to be optimum when it is approximately equal to that of the silicon oxide layer. In particular, a palladium film thinner than 1,000 A. is unstable.

The metal electrode film 4 also serves as a passivation film for a junction thereunder. Said palladium film is not necessarily composed of pure palladium but may be an alloy of palladium.

Figure 2:
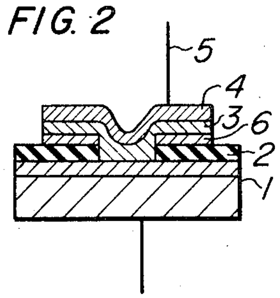
FIG. 2 is a schematic sectional diagram showing another conventional semiconductor device of diode structure.

It is to be noted that only one metal layer is subjected to etching in the above method, whereas two or more layers must be removed in conventional methods exemplified in FIGS. 1 and 2.

Another form of the present method will be described referring to FIGS. 6 to 10.

Usually, the electrode structure for a semiconductor device is made by vapor depositing aluminum on a semiconductor body such as silicon to form an electrode and then connecting a fine gold wire to this aluminum film by thermal compression. But such a structure is disadvantageous in that the aluminum film and the gold wire become alloyed at the contacting portion therebetween and that a phenomenon well known as the purple plague is caused at the interface between the silicon body and the thus-formed alloy. In such a case, the electrode structure becomes easy to peel off. This problem can be eliminated by the following method.

Figure 6:
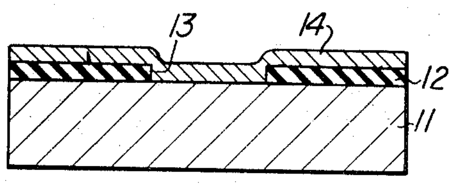
Figure 7:
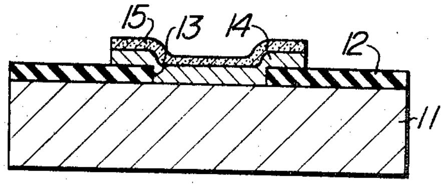

A silicon oxide film 12 is formed on a semiconductor body 11, such as of silicon, to a thickness of about 5,000 A. by a known method such as the thermal decomposition of organo-oxysilane and an opening or window 13 of desired shape is formed in this oxide film 12 to expose the semiconductor body, as can be seen in FIG. 6. An aluminum film 14 is formed to cover the oxide film 12 and the exposed semiconductor body. Then, as is shown in FIG. 7, the aluminum film 14 is etched to a desired electrode shape using a photoresist film 15 as a mask. This mask is removed after photoetching.

Next, a palladium film 16 is formed covering the whole surface of the device as is shown in FIG. 8. When such device is subjected to an inert atmosphere but containing hydrogen, that part of the palladium film 16′ which contacts directly with the silicon oxide film 12 peels off, leaving only the part contacting with the aluminum film 14 as is shown in FIG. 9. According to our experiment, even a palladium film having a thickness of from 2,000 A. to 1 μ caused peeling off in a short duration of about 1 minute when subjected to a nitrogen mixture atmosphere containing about 10 percent of hydrogen. Such peeled palladium film 16′ can be easily removed by strongly blowing a gas of nitrogen or air. Then, a fine gold wire 17 can be bonded to the aluminum-palladium double layer by thermal compression to obtain a device as shown in FIG. 10.

When we tested devices thus formed and using N-type silicon body of a specific resistivity 0.1Ωcm., we could not find any deterioration in electrodes due to the thermal compression of a fine gold wire. The devices were found to have maintained a good ohmic contact property. A palladium film having a thickness below 1,000 A. was found to be unable to effectively prevent the alloying of gold and aluminum when thermally compressed and the test results of such device was unstable. Such devices having a palladium film of a thickness 2,000 A. to 1 μ showed good results.

FIG. 11 shows an intermediate step in another embodiment wherein an intermediate semiconductor device comprises an N-type silicon body 21 having a specific resistivity of 0.1 to !Ωcm., a silicon oxide film 22 having a thickness of about 5,000 A. for example, made by the thermal decomposition of organo-oxysilane, and having an opening 23, a palladium film 24 deposited in vacuum higher than $4+10^{-6}$ torr onto the body and the oxide film to a thickness of 2,000 to 6,000 A., and an aluminum film 25 deposited on the palladium film to a similar thickness. The composite laminate of the films 24 and 25 adheres to the body and the oxide film when disposed in high vacuum, but when subjected to a gas containing hydrogen, it peels off in that part contiguous to the silicon oxide film from the edge portion thereof as is seen in FIG. 12. But the part which is directly contiguous to the silicon body remains firm to form the electrode structure of the device.

When semiconductor devices thus formed were tested for their electrical properties, using a contact needle on the aluminum film, they showed the properties of a Schottky barrier-type diode. But they can also be made to have an ohmic contact by increasing the surface concentration of an impurity in silicon.

Further, an electrode film to be deposited on a palladium film may also be any conventionally used electrode material such as gold or nickel. The results of these materials were similar to that of aluminum.

Yet further, a similar peeling off phenomenon was seen when a metal having a weak bonding force with a silicon oxide layer is deposited on a device to contact with a semiconductor body in a contact window, a palladium film is deposited thereon and such a device is subjected to a gas containing hydrogen.

A semiconductor device made in accordance with the invention can be made to have either one of ohmic or rectifying contact by selecting the metal forming the contact and the type and concentration of impurity in the semiconductor body.

As has been described above, according to the invention, an electrode of a metal film can be made on a semiconductor body easily without the necessity of an etching process.

As is apparent from the foregoing, this invention is not limited to diodes but may be applied to any semiconductor devices.

What is claimed is:

1. A method of making a semiconductor device provided with a silicon oxide film and an electrode layer composed mainly of palladium, the method comprising the steps of:
   - forming a silicon oxide film on a semiconductor body;
   - removing part of the silicon oxide film to expose the semiconductor body;
   - depositing a metal layer mainly composed of palladium on the exposed body and the oxide film;
   - subjecting the resultant semiconductor assembly to a gas containing more than 10% of hydrogen to peel off the part of said metal layer contacting with the silicon oxide layer.

2. A method according to claim 1, where the rest of said gas is selected from the group consisting of nitrogen, air, and other inert gases.

3. A method according to claim 1 comprising the additional step of coating at least the surface of the remaining metal layer with an electrode metal layer which is adhesive to the oxide film.

4. A method according to claim 3, wherein said electrode metal is selected from the group consisting of aluminum, alloy of aluminum, gold and nickel.

5. A method of making a semiconductor device provided with a silicon oxide film and an electrode layer composed mainly of palladium, the method comprising the steps of:
   - forming a silicon oxide film on a semiconductor body;
   - removing part of the silicon oxide film to expose the semiconductor body;
   - depositing an electrode metal layer which is adhesive to the oxide film and the semiconductor body on the exposed semiconductor body and on the silicon oxide film;
   - forming said metal layer into a shape desired for said electrode;
   - depositing a metal layer composed mainly of palladium on said desired shaped metal layer and on said silicon oxide film;
   - subjecting the resultant semiconductor assembly to a gas containing more than 10 percent of hydrogen to peel off the part of said palladium layer contacting with the silicon oxide film.

6. A method of making a semiconductor device provided with a silicon oxide film and an electrode layer composed mainly of palladium, the method comprising the steps of:

forming a silicon oxide film on a semiconductor body;

removing part of the silicon oxide film to expose the semiconductor body;

depositing a metal layer mainly composed of palladium on the exposed body and the oxide film;

depositing an electrode metal layer selected from the group consisting of aluminum, alloy of aluminum, gold and nickel on the surface of said palladium layer;

subjecting the resultant semiconductor assembly to a gas containing more than 10 percent of hydrogen to peel off the part of said palladium layer contacting with the silicon oxide film together with said metal layer contacting with said part of said palladium layer.

7. A method of making a semiconductor device provided with a silicon oxide film and an electrode layer composed mainly of palladium, the method comprising the steps of:

forming a silicon oxide film on a semiconductor body;

removing part of the silicon oxide film to expose the semiconductor body;

depositing an electrode metal layer adhesive to said silicon oxide film on the exposed body and on the oxide film;

depositing a metal layer composed mainly of palladium on the surface of said electrode metal layer;

subjecting the resultant semiconductor assembly to a gas containing more than 10 percent of hydrogen to peel off said palladium layer above said silicon oxide film together with said metal layer contacting with said silicon oxide film.

* * * * *